US008867269B2

(12) United States Patent
Fujiu

(10) Patent No.: US 8,867,269 B2
(45) Date of Patent: Oct. 21, 2014

(54) SEMICONDUCTOR MEMORY DEVICE

(71) Applicant: Masaki Fujiu, Kanagawa-ken (JP)

(72) Inventor: Masaki Fujiu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 13/709,291

(22) Filed: Dec. 10, 2012

(65) Prior Publication Data

US 2013/0208539 A1     Aug. 15, 2013

(30) Foreign Application Priority Data

Feb. 10, 2012    (JP) ................... 2012-027700

(51) Int. Cl.
*G11C 11/56*     (2006.01)
*G11C 16/06*     (2006.01)
*G11C 16/04*     (2006.01)

(52) U.S. Cl.
CPC ............ *G11C 16/06* (2013.01); *G11C 16/0483* (2013.01); *G11C 11/5628* (2013.01); *G11C 11/5642* (2013.01); *G11C 2211/5646* (2013.01)
USPC ................... 365/185.03; 365/185.21

(58) Field of Classification Search
CPC .................................................. G11C 11/5642
USPC ........................ 365/185.03, 185.21
See application file for complete search history.

(56) References Cited

U.S. PATENT DOCUMENTS

| 5,673,383 A | 9/1997 | Sukegawa |
| 2004/0213031 A1 | 10/2004 | Hosono et al. |
| 2006/0268608 A1 | 11/2006 | Noguchi et al. |
| 2008/0106946 A1 | 5/2008 | Inoue et al. |
| 2008/0270072 A1 | 10/2008 | Sukegawa |
| 2009/0049364 A1 | 2/2009 | Jo et al. |
| 2009/0073763 A1 | 3/2009 | Hosono |
| 2009/0177851 A1 | 7/2009 | Tu et al. |
| 2010/0142270 A1 | 6/2010 | Shibata |
| 2010/0149869 A1* | 6/2010 | Kim et al. ............ 365/185.03 |
| 2012/0030528 A1 | 2/2012 | Hida et al. |
| 2012/0268994 A1 | 10/2012 | Nagashima |
| 2013/0128662 A1* | 5/2013 | Song et al. ............ 365/185.03 |

FOREIGN PATENT DOCUMENTS

| JP | 5-282880 A | 10/1993 |
| JP | 2004-326866 A | 11/2004 |
| JP | 2004-326867 A | 11/2004 |
| JP | 2008-117471 A | 5/2008 |

(Continued)

*Primary Examiner* — Harry W Byrne
*Assistant Examiner* — Lance Reidlinger
(74) *Attorney, Agent, or Firm* — Oblon, Spivak, McClelland, Maier & Neustadt, L.L.P.

(57) ABSTRACT

A semiconductor memory device includes: a memory cell array including a plurality of memory cells, a plurality of word lines, and a plurality of bit lines, and a control circuit. A first memory cell stores first data of n bits, a second memory cell stores second data used to determine whether data of k bits is stored in the first memory cell, and the control circuit performs first determination of determining data read from the data of the second memory cell, performs second determination of determining data read from the second memory cell by supplying the first word line with a second read voltage different from the first read voltage, and outputs either one of a result obtained by reading the data stored in the first memory cell at the first read voltage and a result obtained by reading the data stored in the first memory cell at the second read voltage, based on a result of the second determination.

16 Claims, 10 Drawing Sheets

(56) References Cited

FOREIGN PATENT DOCUMENTS

| | | |
|---|---|---|
| JP | 2008-269473 A | 11/2008 |
| JP | 2009-48758 A | 3/2009 |
| JP | 2009-70501 A | 4/2009 |
| JP | 2009-163863 A | 7/2009 |
| JP | 2009-205578 A | 9/2009 |
| JP | 2010-515199 A | 5/2010 |
| JP | 2010-160873 A | 7/2010 |
| JP | 2011-100519 A | 5/2011 |
| WO | WO 2008/082888 A1 | 7/2008 |

* cited by examiner

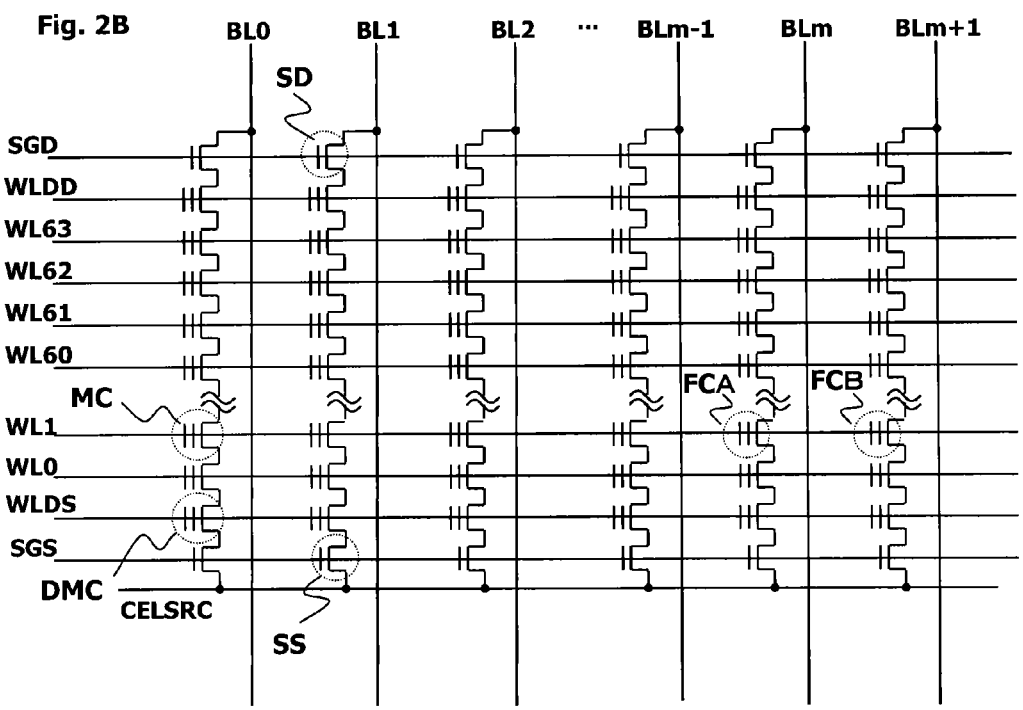

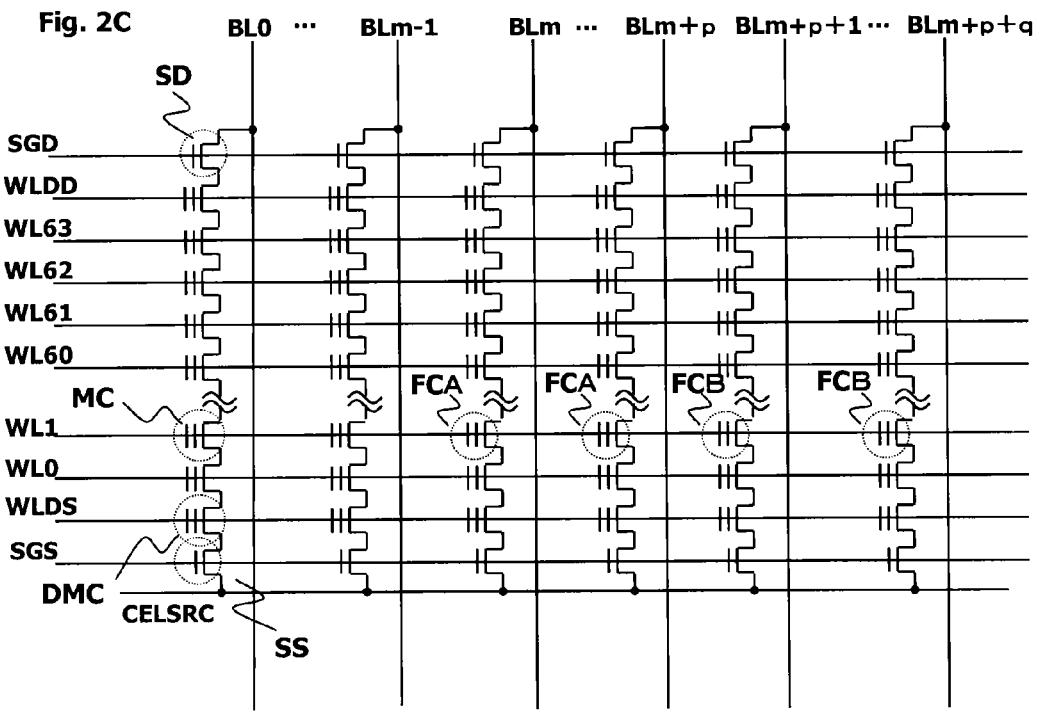
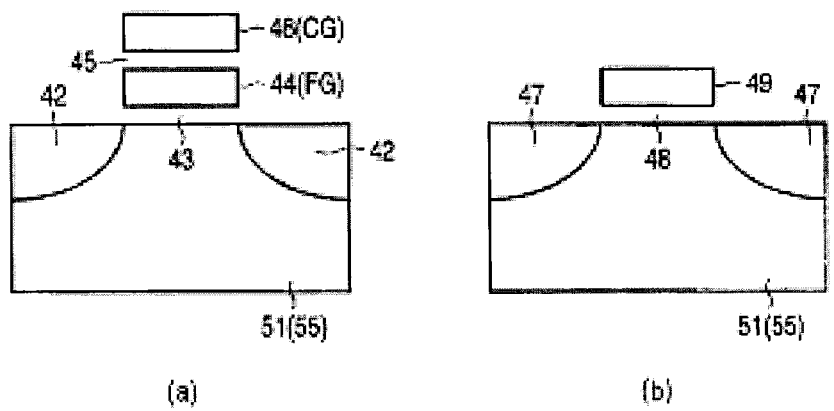

Fig. 4
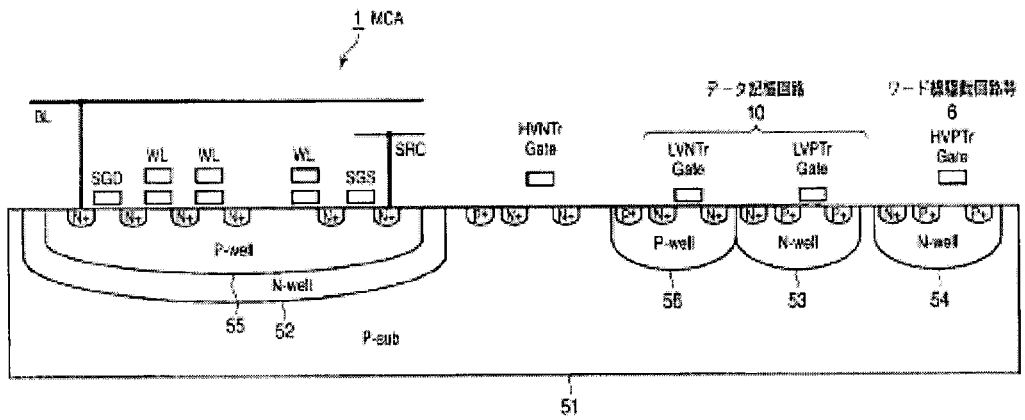
Fig. 5
|  | Cell(P-Well) | Cell(N-Well) | HV Tr(Psub) | LV Tr(P-Well) | LV Pch Tr (N-Well) | HV Pch Tr (N-Well) |
|---|---|---|---|---|---|---|
| Erase | Vera(20V) | Vera(20V) | Vss(0V) | Vss(0V) | Vdd(2.5V) | Vdd(2.5V) |
| Write | Vss(0V) | Vss(0V) | Vss(0V) | Vss(0V) | Vdd(2.5V) | Vdd(2.5V) Vpgm |
| Read | Vfex(1.6V) | Vfex(1.6V) | Vss(0V) | Vss(0V) | Vdd(2.5V) | Vdd(2.5V) Vreadh+Vth |
Fig. 6A
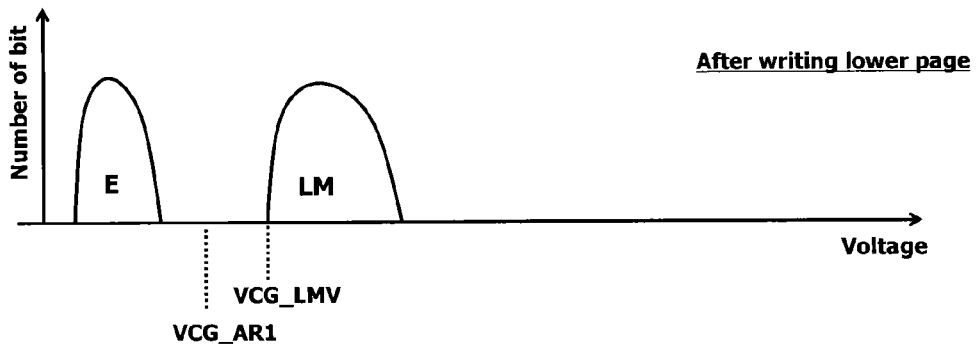

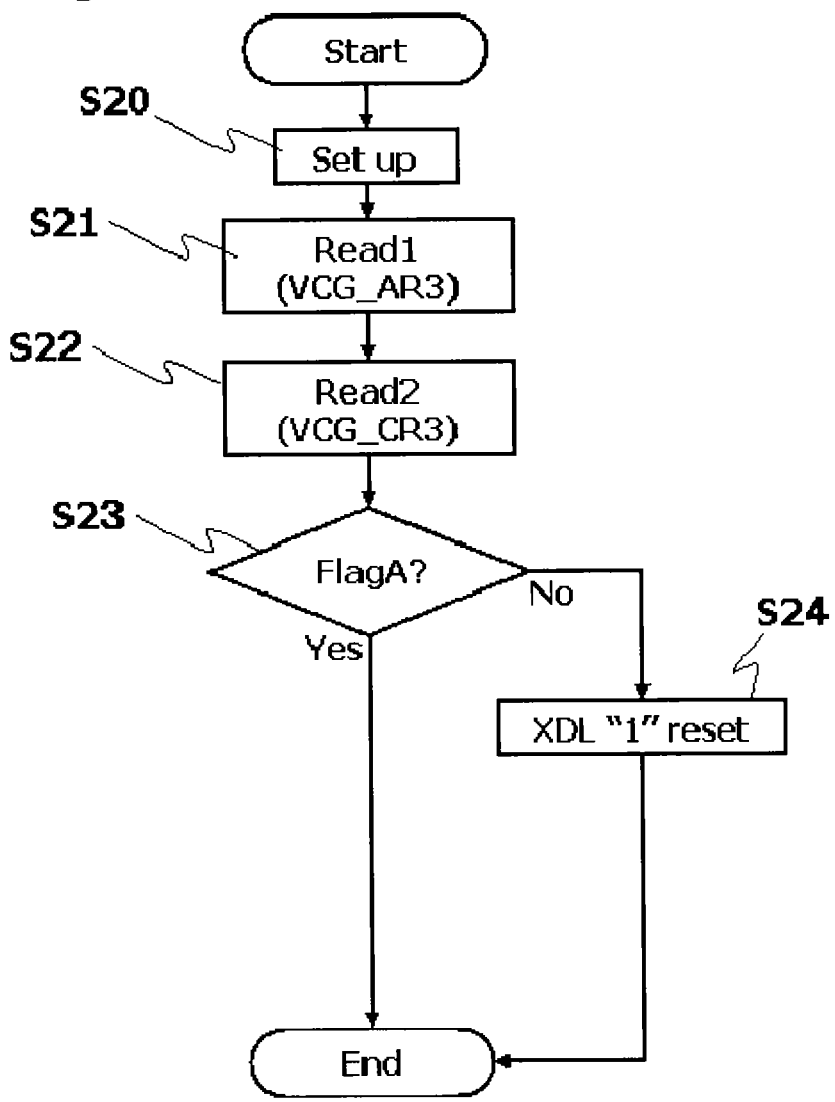

SEMICONDUCTOR MEMORY DEVICE

CROSS-REFERENCE TO RELATED APPLICATIONS

This application is based upon and claims the benefit of priority from the prior Japanese Patent Application No. 2012-027700, filed Feb. 10, 2012, the entire contents of which are incorporated herein by reference.

BACKGROUND OF THE INVENTION

1. Field of the Invention

The present invention relates to NAND flash memory using EEPROM, for example, and particularly relates to a semiconductor memory device capable of storing multi-valued data by using a flag cell.

2. Description of the Related Art

In NAND flash memory, multiple memory cells arranged in a column direction are connected in series to form each of memory strings, and each memory string is connected to a corresponding one of bit lines via a select gate. Each bit line is connected to a sense amplifier circuit configured to sense and latch write data and read data. All or half of the multiple cells arranged in a word line direction are simultaneously selected and a write operation or a read operation is performed in a lump for all or half of the multiple cells thus simultaneously selected. Multiple NAND cells arranged in the word line direction form a block and an erase operation is executed in units of the blocks. In the erase operation, a threshold voltage of each memory cell is set to a negative value. In the write operation, the threshold voltage is raised by injecting electrons into the memory cell.

In the NAND cells, there is a case where data is stored separately in a lower page and an upper page in several operations to store multi-valued data. At this time, a flag cell is used in some cases to determine whether data is written in the upper page.

BRIEF SUMMARY OF THE INVENTION

A semiconductor memory device according to an aspect of the present invention includes: a memory cell array including a plurality of memory cells which are each capable of storing data of n bits (n is a natural number of 2 or more) and which are arranged in a matrix, a plurality of word lines which are connected to the plurality of memory cells, and a plurality of bit lines which are each connected to one end of corresponding ones of the plurality of memory cells; and a control circuit, wherein a first memory cell of the plurality of memory cells stores first data of n bits, a second memory cell of the plurality of memory cells stores second data used to determine whether data of k bits (k is a natural number from 2 to n inclusive) is stored in the first memory cell, and the control circuit: performs first determination of determining data read from the data of the second memory cell by supplying a first read voltage to a first word line of the plurality of word lines, performs second determination of determining data read from the second memory cell by supplying the first word line with a second read voltage different from the first read voltage, based on a result of the first determination, and outputs either one of a result obtained by reading the data stored in the first memory cell at the first read voltage and a result obtained by reading the data stored in the first memory cell at the second read voltage, based on a result of the second determination.

BRIEF DESCRIPTION OF THE SEVERAL VIEWS OF THE DRAWINGS

FIGS. 2A, 2B, and 2C are circuit diagrams each showing an example of a memory cell array of the embodiment.

FIGS. 3A and 3B are cross-sectional views respectively showing an example of a memory cell and an example of a select transistor.

FIG. 4 is a cross-sectional view showing an example of a cross-section of NAND flash memory.

FIG. 5 is a table showing an example of voltages supplied to regions shown in FIG. 4.

FIGS. 6A and 6B are graphs each showing an example of threshold distribution areas of the memory cell.

FIG. 10 is a flowchart showing an example of an upper page read operation in the embodiment.

DETAILED DESCRIPTION OF THE INVENTION

Figure 1:
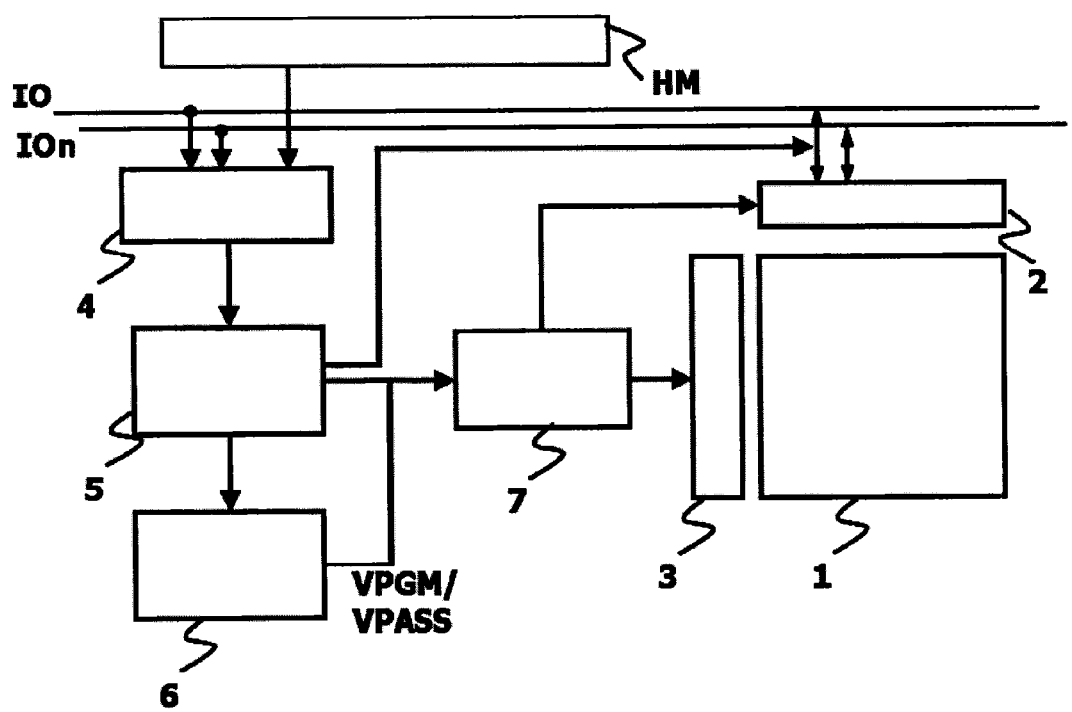
FIG. 1 is a configuration diagram showing an example of a semiconductor memory device of an embodiment of the invention.

Embodiments of the invention will be described below by referring to the drawings. Note that the drawings are schematic, and that the dimensions and the proportions in each drawing are different from their respective counterparts in the actual semiconductor device. In addition, the dimensions and proportions in one drawing may be different from their respective counterparts in another drawing. In addition, the embodiments to be described below illustrate devices and methods that may be employed to implement the technical idea of the invention. Accordingly, the shapes, the structures, the arrangement, or the like of the constituent parts does not limit the technical idea of the invention. The technical idea of the invention may be modified in various ways without departing from the gist of the invention.

An embodiment of the present invention is described below with reference to the drawings.

First, a semiconductor memory device of the embodiment is described by giving an example of a configuration of a NAND flash memory with reference to FIGS. 1, 2A, 2B, and 2C.

The NAND flash memory includes a memory cell array 1 in which memory cells MC configured to store data are arranged in a matrix. The memory cell array 1 includes multiple bit lines BL, multiple word lines WL, a source line SRC, and the multiple memory cells MC. Each memory cell MC can store data of n-bits (n being a natural number equal to or greater than 2).

Various commands CMD and addresses ADD which are supplied from a host or a memory controller HM and which are used to control operations of the NAND flash memory as well as data DT are inputted into an IO buffer 4. Write data inputted into the IO buffer 4 is supplied to a bit line BLs selected by a bit line control circuit 2, via data input-output lines IO and IOn. Moreover, the various commands CMD and addresses ADD are inputted into a control circuit 5. The control circuit 5 controls a step-up circuit 6 and a driver 7 on the basis of the commands CMD and addresses ADD.

The step-up circuit 6 generates voltages required to write, read, and erase data and supplies the voltages to the driver 7 in accordance with control of the control circuit 5. The driver 7 supplies these voltages to the bit line control circuit 2 and a word line control circuit 3 in accordance with control of the control circuit 5. The bit line control circuit 2 and the word line control circuit 3 use these voltages to read data from the memory cells MC, to write data into the memory cells MC, and to erase data from the memory cells MC.

The bit line control circuit 2 configured to control voltages of the bit lines BL and the word line control circuit 3 configured to control voltages of the word lines WL are connected to the memory cell array 1. The bit line control circuit 2 and the word line control circuit 3 are also connected to the driver 7.

Specifically, the driver 7 controls the bit line control circuit 2 on the basis of the addresses ADD and causes the bit line control circuit 2 to read the data from the memory cells MC in the memory cell array 1 via the bit lines BL. Moreover, the driver 7 controls the bit line control circuit 2 on the basis of the addresses ADD and causes the bit line control circuit 2 to write the data into the memory cells MC in the memory cell array 1 via the bit lines BL.

Note that the set of the bit line control circuit 2, the word line control circuit 3, the driver 7, and the control circuit 5 may be referred to as the "control circuit" as a whole in some cases.

Figure 2A:
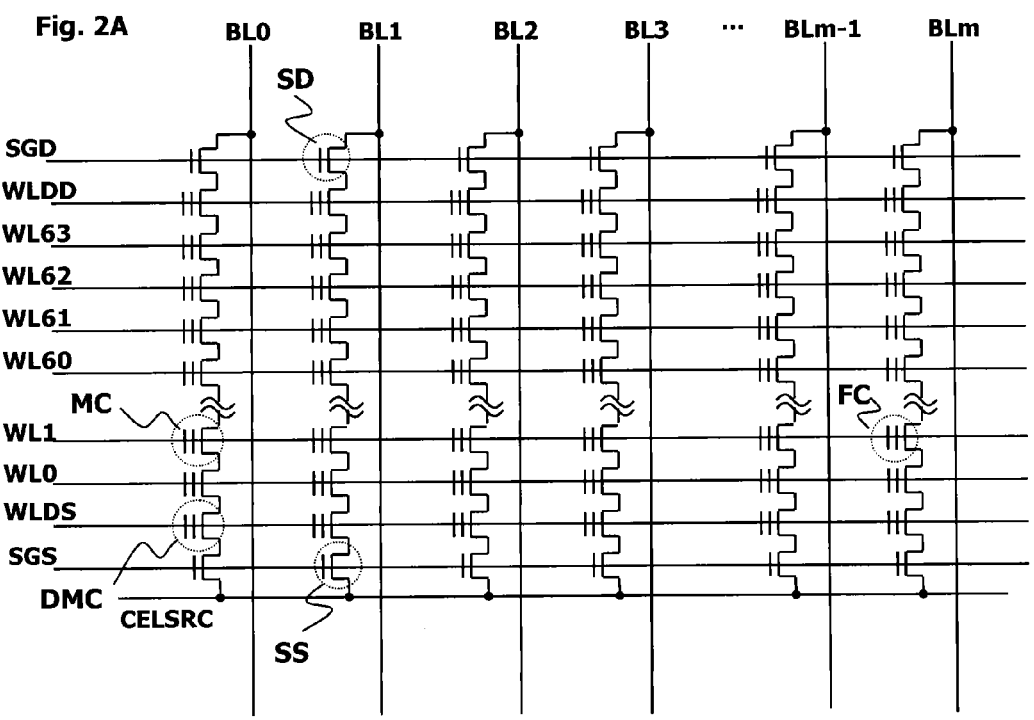

FIG. 2A shows an example of a circuit configuration of the memory cell array 1 shown in FIG. 1. Multiple memory cells are arranged in the memory cell array 1. A single NAND string NS is formed of a memory string including, for example, 64 memory cells MC connected in series in a bit line direction, and select transistors SD and SS. A dummy memory cell DMC may be arranged between the memory string and the select transistor SD or between the memory string and the select transistor SS.

Multiple (m+1 in the example of FIG. 2A) NAND strings NS are arranged in a word line direction. One end of each NAND string NS is connected a corresponding one of the multiple bit lines BL and the other end is connected to a common source line CELSRC. It can be also said that the multiple NAND strings NS are arranged in a word line direction, one end of each NAND string NS is connected to a corresponding one of the multiple bit lines BL, and the other end is connected to a common source line CELSRC. The gate electrodes of the select transistors SD and SS are connected respectively to select gates SGD and SGS.

The word lines WL each extend in the word line direction and connect the memory cells MC in common which are arranged side by side in the word line direction. The memory cells MC connected in the word line direction constitute one page. Writing of the data into the memory cells MC is performed in units of pages. It is to be noted that the "page" representing the unit of the writing is different in concept from the "page" to be described later in conjunction with the "lower page" and "upper page" which are write bit levels of data.

A flag cell FC is disposed in a bit line BLm instead of the memory cell MC. The structure of the flag cell FC may be the same as that of the memory cell MC.

Moreover, as shown in FIG. 2B, a flag cell FCA and a flag cell FCB may be disposed respectively in the bit line BLm and a bit line BLm+1. In other words, instead of a single flag cell FC, multiple flag cells FC may be disposed in a single word line WL. Moreover, as shown in FIG. 2C, multiple flag cells FCA and multiple flag cell FCB may be disposed in a single word line WL. In the drawing, p is a natural number equal to or greater than 1 and q is a natural number equal to or greater than 2. In this configuration, the flag cells FCA can be used as flag cells for an upper page and the flag cells FCB can be used as flag cells for a lower page.

FIGS. 3A and 3B show cross-sectional views respectively of the memory cell and the select transistor. FIG. 3A shows the memory cell. An n-type diffusion layer 42 serving as a source and a drain of the memory cell is formed in a substrate 51 (p-type well region 55 to be described later). A charge storage layer (FG) 44 is formed on the P-type well region 55 with a gate insulating film 43 in between. A control gate (CG) 46 is formed on the charge storage layer 44 with an insulating film 45 in between. FIG. 3B shows the select transistor. An n-type diffusion layer 47 serving as a source and a drain is formed in the P-type well region 55. A control gate 49 is formed on the P-type well region 55 with a gate insulating film 48 in between.

A threshold voltage of the memory cell can be changed by storing charge in the charge storage layer (FG). Data can be stored by assigning data on the basis of this threshold voltage. Generally, multiple memory cells are used to store a large amount of data. As a consequence, the thresholds of the memory cells form threshold distribution areas corresponding to respective pieces of data.

FIG. 4 shows a cross-sectional view of the NAND flash memory. For example, N-type well regions 52, 53, and 54 and a P-type well region 56 are formed in the P-type semiconductor substrate 51. The P-type well region 55 is formed in the N-type well region 52, and memory cells Tr constituting the memory cell array 1 are formed in the P-type well region 55. Moreover, a low-voltage P-channel transistor LVPTr and a low-voltage N-channel transistor LVNTr constituting a data storage circuit 10 are formed respectively in the N-type well region 53 and the P-type well region 56. A high-voltage N-channel transistor HVNTr connecting the bit lines and the data storage circuit 10 is formed in the substrate 51. Furthermore, a high-voltage P-channel transistor HVPTr constituting, for example, a word line drive circuit and the like is formed in the N-type well region 54. As shown in FIG. 4, the high-voltage transistors HVNTr and HVPTr each have a gate insulating film which is thicker than those of the low-voltage transistors LVNTr and LVPTr, for example.

FIG. 5 shows an example of voltages supplied to the regions shown in FIG. 4. The voltages shown in FIG. 5 are supplied to the regions in an erase operation, a write operation, and a read operation. Here, Vera is a voltage applied to the substrate when data is erased, Vss is a ground voltage, Vdd is a power supply voltage, Vpgmh is a voltage equal to a total of a voltage Vth and a voltage Vpgm supplied to the word line when data is written, and Vreadh is a voltage equal to a total of the voltage Vth and a voltage Vread supplied to the word line when data is read.

Next, description is given of the read operation. The read operation is performed in such a way that the control circuit selects one word line WLs from the multiple word lines WL and applies a read voltage to the selected word line WLs. In other words, a single page is selected. A pass voltage which sets the memory cells MC to an on state is applied to unselected word lines WLns other than the selected word line WLs, regardless of the threshold voltages of the memory cells MC. There is no need to apply the pass voltage of the same level to all of the unselected word lines WLns and the level of the pass voltage may differ among the unselected word lines WLns. Here, description is given of an example in which a so-called voltage sensing method is used. First, 0 V is applied to the common source line and a pre-charge voltage is applied to the bit lines BL. Thereafter, one set of the select transistors SD and SS are turned on. At this time, when the threshold voltage of the corresponding one of the memory cells MC is higher than a verify voltage, the voltage charged in a corresponding one of the bit lines BL is not discharged. This result is sensed and latched by a sense amplifier and data of the memory cell MC is determined to be "0" data. Meanwhile, when the threshold voltage of the memory cell MC is lower than the verify voltage, the voltage charged in the bit line BL is discharged. This result is sensed and latched by the sense amplifier and data of the memory cell MC is determined to be "1" data. Note that 0 V can be applied to the P-type well region 55 of the memory cell (a positive voltage is applied in some cases and, in such a case, a positive voltage is applied also to the common source line). Here, in the read operation of the embodiment, data can be sensed and latched also by using a so-called current sensing method instead.

Figure 6B:
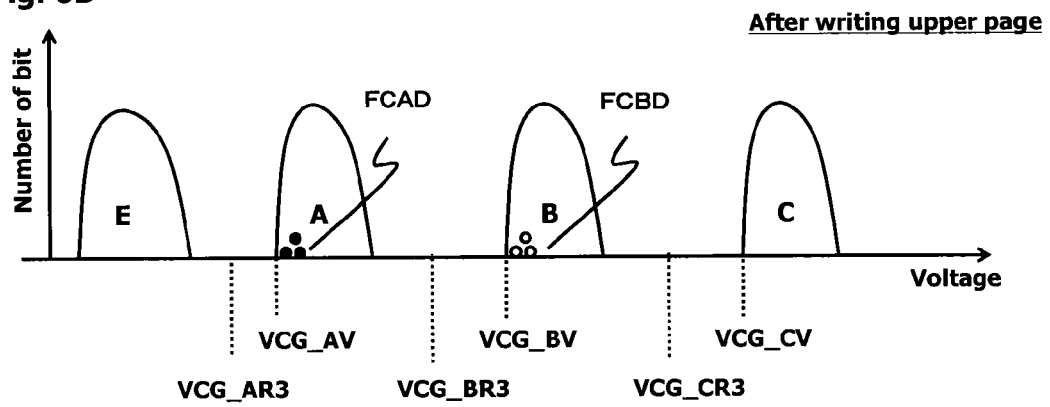

In the case of storing data of two bits in each memory cell MC, as shown in FIG. 6B, the thresholds of the multiple memory cells MC have four threshold distribution areas. Here, the threshold voltage areas include those of an "E" level (erased state), an "A" level, a "B" level, and a "C" level in the ascending order of the threshold voltage. A read voltage is set between each two adjacent threshold distribution areas to determine which threshold distribution area the threshold voltage of each memory cell belongs to.

The write operation includes a program operation of applying a write voltage and a verify operation of verifying the threshold voltage of each memory cell after the program operation. Note that there is no need to perform the verify operation after every program operation. Various changes can be made such as performing the verify operation once in every several times of the program operation.

The verify operation is performed in such a way that the control circuit selects one word line WLs from the multiple word lines WL and applies the verify voltage to the selected word line WLs. In other words, a single page is selected. A pass voltage which sets the memory cells MC to the on state is applied to the unselected word lines WLns other than the selected word line WLs, regardless of the threshold voltages of the memory cells MC. There is no need to apply the pass voltage of the same level to all of the unselected word lines WLns and the level of the pass voltage may differ among the unselected word lines WLns. Here, description is given of an example in which the so-called voltage sensing method is used. First, 0 V is applied to the common source line and a pre-charged voltage is applied to the bit lines BL. Thereafter, one set of the select transistors SD and SS are turned on. At this time, when the threshold voltage of the corresponding one of the memory cells MC is higher than a verify voltage, the voltage charged in a corresponding one of the bit lines BL is not discharged. This result is sensed and latched by the sense amplifier and data of the memory cell MC is determined to be the "0" data. Meanwhile, when the threshold voltage of the memory cell MC is lower than the verify voltage, the voltage charged in the bit line BL is discharged. This result is sensed and latched by the sense amplifier and data of memory cell MC is determined to be the "1" data. Note that 0 V can be applied to the P-type well region 55 of the memory cell (a positive voltage is applied in some cases and, in such a case, a positive voltage is applied also to the common source line). Here, in the verify operation of the embodiment, data can also be sensed and latched by using the so-called current sensing method instead.

A so-called LM write method is used as the write operation in NAND flash memory in some cases to reduce variation in threshold due to coupling between charge storage layers. Description is given of the LM write method by using FIGS. 6A and 6B.

The LM write method is a method of storing data of two bits (four values) in each memory cell MC, for example, by writing the data into a lower page and an upper page in separate stages. First, as shown in FIG. 6A, in a data write operation for the lower page, the control circuit controls the write voltage in such a way that the write voltage has two threshold distribution areas. Here, the "1" data and the "0" data are to be written. The "0" data is assigned to a LM level being an intermediate threshold level between the "A" level and the "B" level in the final four threshold distribution areas. The "1" data is assigned to the "E" level being an erased state. Moreover, the verify operation of the "LM" level of the lower page is performed with the verify voltage at VCG_LMV. Note that reading of the "LM" level is performed at a read voltage VCG_AR1 being a voltage between the "E" level and the "LM" level. The read voltage VCG_AR1 can be set to the same level as a read voltage VCG_AR3 to be described later or to a level slightly lower than the read voltage VCG_AR3.

An upper page write operation is performed after the lower page write operation. As shown in FIG. 6B, in the upper page write operation, the control circuit controls the write voltage in such a way that the write voltage has four threshold distribution areas. The "A" level is changed in threshold voltage from the "E" level being the erased state, and the "B" level and the "C" level are changed in threshold voltage from the "LM" level. Hence, threshold distribution areas for four values can be formed. Note that "11" data is assigned to the "E" level, "01" data to the "A" level, "00" data to the "B" level, and "10" data to the "C" level. Here, in the "**" data described above, the right digit shows the data of the lower page and the left digit shows the data of the upper page. Moreover, the verify operations of the "A", "B", and "C" levels of the upper page are performed with the verify voltage at VCG_AV, VCG_BV, and VCG_CV (VCG_AV<VCG_BV<VCG_CV), respectively.

In the case of using the LM write method, there are a state where only the write operation for the lower page is completed and the write operation for the upper page is not performed yet (hereinafter also referred to as a "state before writing the upper page") and a state where the write operation for the upper page is completed (hereinafter also referred to as a "state after writing the upper page"). Hence, there is a need to distinguish between the states before and after writing the upper page. The distinction is made by using the flag cell FC.

In the upper page write operation, data of the flag cell FC is written in the "B" level. In other words, the flag data of the flag cell FC is assigned to the "B" level. This flag cell is also referred to as a flag cell FCB for the lower page in some cases. Specifically, the state is determined depending on whether the threshold voltage of the flag cell FCB is higher or lower than a read voltage VCG_BR3. To be more specific, in the read operation, the determination of the threshold voltage of the flag cell FCB is performed by setting the read voltage equal to VCG_BR3. When the result obtained by reading the flag cell FCB is the "0" data in this condition, the memory cell is in the state after writing the upper page. On the other hand, when the result is the "1" data, the memory cell is in the state before writing the upper page.

When the flag cells FCA and FCB are provided respectively for the upper page and the lower page as shown in FIG. 2B, the flag data of the flag cell FCA can be written into the "A" level and the flag data of the flag cell FCB can be written into the "B" level as shown in FIG. 6B. Here, the flag data FCAD of the flag cell FCA is assigned to the "A" level and the flag data FCBD of the flag cell FCB is assigned to the "B" level.

Figure 7:
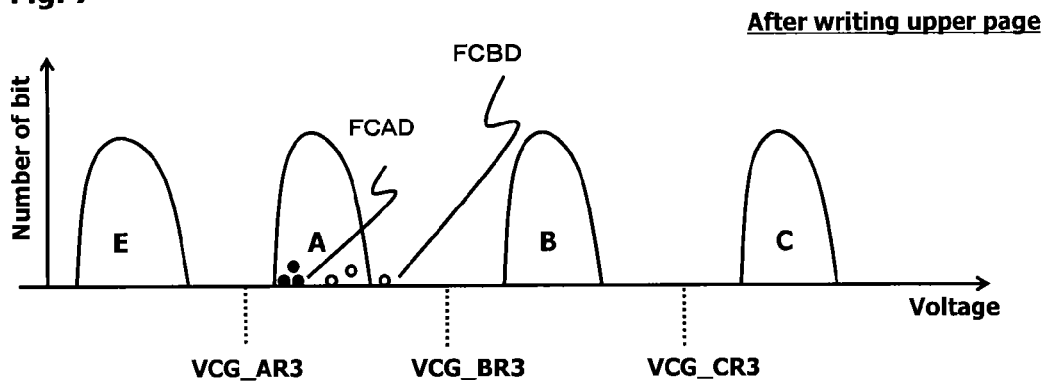
FIG. 7 is a graph showing an example when a threshold of a flag cell decreases.

There is a possibility that the threshold of each memory cell MC may become low over time because the charge stored in the charge storage layer may escape. As a result, the data stored in the memory cell MC may change. In such a case, the changed data can be corrected by using an error correction code (ECC) circuit. However, in many cases, since the flag data is not data used by a user (hereinafter also referred to as "user data"), an ECC for the flag data of the flag cell FC is not generated by the ECC circuit in order to suppress a delay in the circuit operation and an increase in parity bits which would otherwise occur due to the ECC generation. Hence, when the data change occurs in the flag data of the flag cell FCB as shown in FIG. 7, the user data cannot be correctly read out.

Specifically, when the flag data of the flag cell FCB changes and the threshold voltage thereby becomes lower than the read voltage VCG_BR3, the flag data is determined to be the "1" data. Hence, the read operation for the state before writing the upper page is performed though the data in the memory cells MC are in the state after writing the upper page. As a consequence, the control circuit performs the read operation again at the read voltage VCG_AR1 to perform determination between the "E" level and the "LM" level. However, the data in the memory cells MC are in fact in the state after writing the upper page. Hence, although a result obtained by performing the read operation at the read voltage VCG_BR3 should be stored in data latches, different data is read as a matter of fact. Thus, the user data cannot be read out properly.

In view of this, the following read operation is performed in the embodiment.

(Lower Page Read Operation)

Figure 8A:
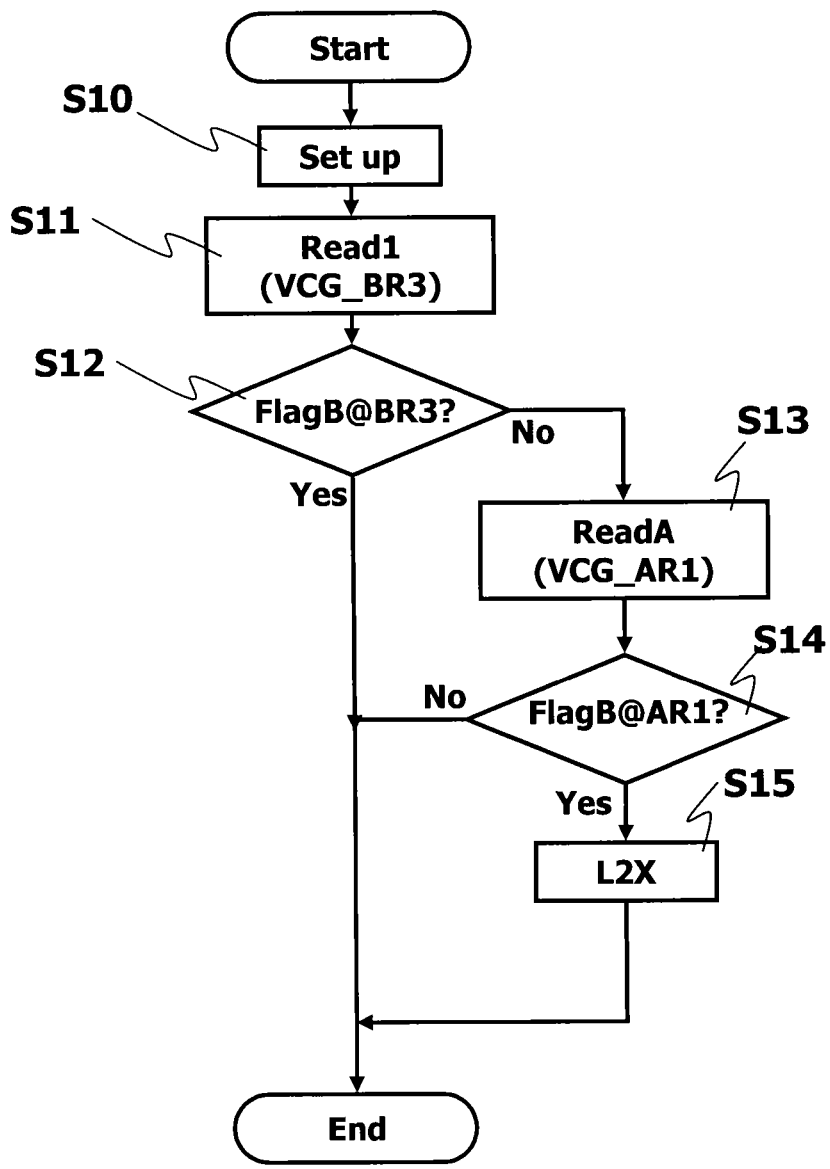
FIG. 8A is an example of a flowchart of a lower page read operation in the embodiment and FIG. 8B is a circuit diagram showing an example of a sense amplifier and data latches of the embodiment.

FIG. 8A shows an example of a flowchart of a lower page read operation according to the embodiment. Moreover, FIG. 8B is a circuit diagram showing an example of a sense amplifier and data latches according to the embodiment.

Figure 8B:
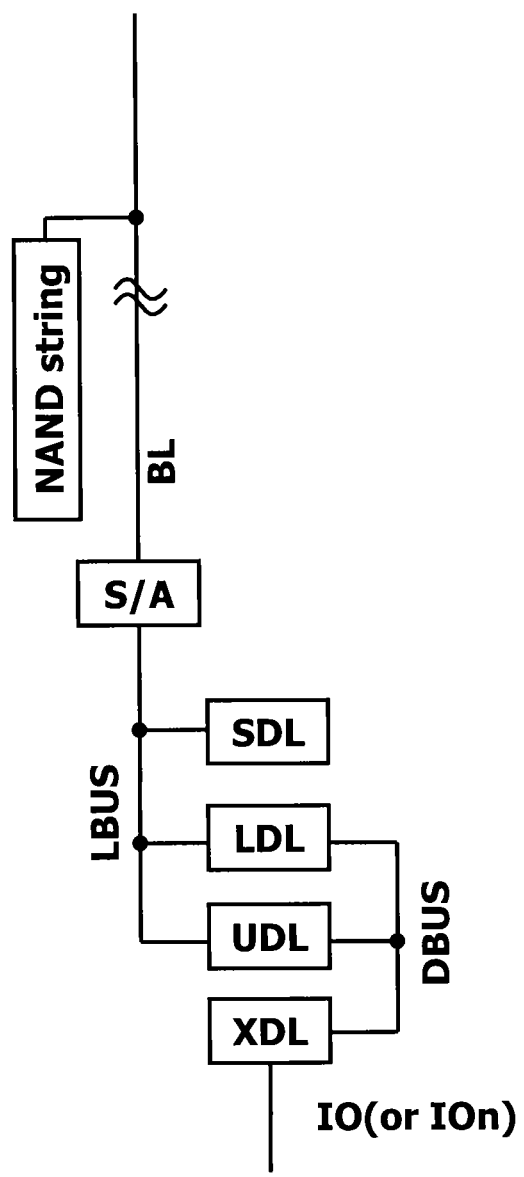

As shown in FIG. 8B, one end of the NAND string NS is connected to the bit line BL. One end of the bit line BL is connected to a sense amplifier S/A. Moreover, the sense amplifier S/A is connected to multiple data latches (data latches SDL, LDL, and UDL in this example) via a local bus LBUS. Moreover, the data latches LDL and UDL are connected to a data latch XDL via a data bus DBUS. The data latch XDL is connected to the data input-output line IO (or the data input-output line IOn).

The bit line control circuit 2 controls the sense amplifier S/A and causes the sense amplifier S/A to perform the read operation. The address ADD is inputted from the host or the memory controller HM, then the word line control circuit 3 selects the selected word line WLs corresponding to a row address, and the page to be read is thus selected. Thereafter, a read start command CMD is inputted and the read operation is executed. Data sensed and latched by the sense amplifier S/A is stored in the data latches LDL and UDL. Then, the data is moved to the data latch XDL and is outputted to the host or the memory controller HM via the data input-output line IO.

A set of the sense amplifier S/A and the data latches SDL, LDL, UDL, and XDL are provided for each bit line BL. However, one set of the sensor amplifier and the data latches may be provided for each group of multiple bit lines BL.

Figure 9:
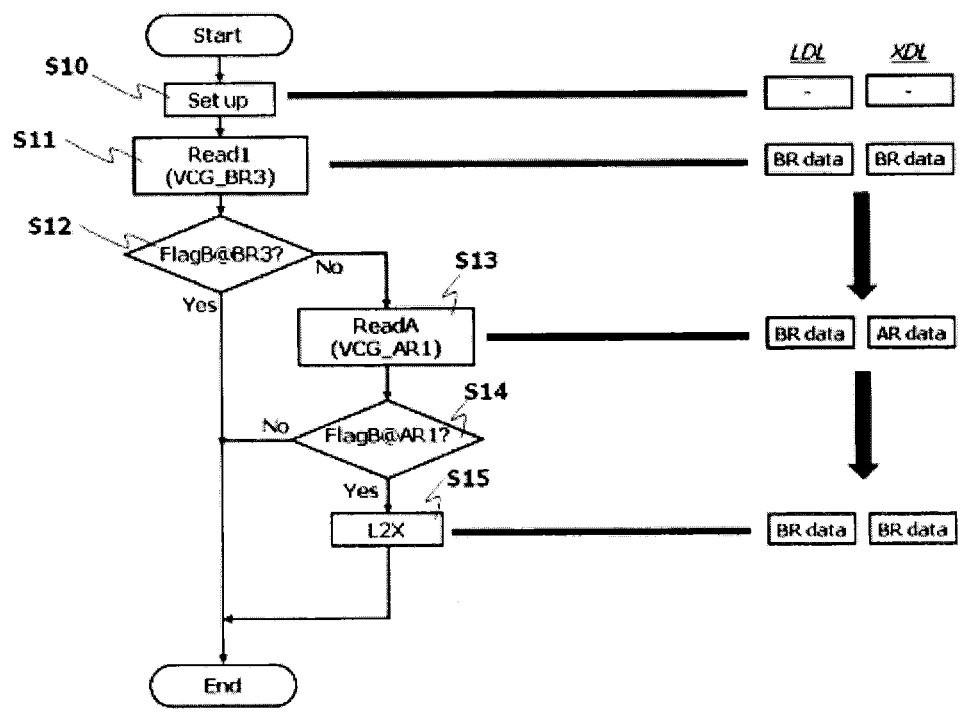
FIG. 9 is a diagram showing an example of the lower page read operation and comparison of data stored in the data latches in the embodiment.

Next, description is given of an example of a read flow and an operation of the internal data latches by using FIG. 9. First, in step S10, the control circuit activates the step-up circuit 6 and generates an internal power supply voltage required to perform the read operation. Thereafter, the control circuit 5 controls the driver 7, the bit line control circuit 2, and the word line control circuit 3 and thereby performs the read operation of selected memory cells MCs (step S11).

Specifically, the word line control circuit 3 applies the read voltage VCG_BR3 to the selected word line WLs. In addition, the pass voltage is supplied to the unselected word lines WLns. At this time, a voltage is supplied to selected NAND string NS from the sense amplifier S/A via the bit line BL and the threshold voltages of the selected memory cells MCs and the flag cell FCB connected to the selected word line WLs are determined. Specifically, the following operation is performed. The read voltage VCG_BR3 is supplied to the selected word line WLs. When the threshold voltage of each of the selected memory cells MCs and the flag cell FCB is higher than the read voltage VCG_BR3, the potential of the corresponding bit line BL does not decrease since the memory cell MC is not turned on. As a result, the charge in a capacitor included in the sense amplifier S/A is not discharged and this potential is detected. The sense amplifier S/A thus detects the "0" data.

Meanwhile, when the threshold voltage of each of the selected memory cells MCs and the flag cell FCB is lower than the read voltage VCG_BR3, the potential of the corresponding bit line BL decreases since the memory cell MC is turned on. As a result, the charge in the capacitor included in the sense amplifier S/A is discharged and this potential is detected. The sense amplifier S/A thus detects the "1" data.

The data thus read is stored in the data latch LDL and the data latch XDL. Specifically, the control circuit stores the read data in the data latch LDL and copies this data to the data latch XDL. Note that the data latches LDL for one page and the data latches XDL for one page exist. Moreover, the flag cells FC for one page exist.

Thereafter, in step S12, the control circuit determines the flag data FCBD of the flag cell read at the read voltage VCG_BR3. Specifically, the control circuit extracts the flag data from the data latch XDL and determines whether the flag data is the "0" data or the "1" data.

When the flag data is the "1" data, the current state is determined as the state before writing the upper page and the operation proceeds via an arrow "No." Meanwhile, when the flag data is the "0" data, the current state is determined as the state after writing the upper page and the operation proceeds via an arrow "Yes." However, there is a case where the threshold of the flag cell FCB falls below the read voltage VCG_BR3 due to a change in the flag data FCBD that actually occurs in the state after writing the upper page. In this case, the state is determined as the state before writing the upper page and the operation therefore proceeds via the arrow "No."

However, in the embodiment, the read voltage is changed and the read operation is performed again in step S13. Specifically, the control circuit supplies the read voltage VCG_AR1 to the selected word line WLs to perform the read operation. Note that the read voltage VCG_AR1 is lower than the read voltage VCG_BR3. Moreover, the read voltage VCG_AR1 can be defined as a voltage between the "A" level and the "E" level.

In this step, the result obtained by reading the selected memory cells MCs and the flag cell FCB is sensed and latched by the sense amplifier S/A. The data thus read is held in the XDL being the data latch. Note that the data which has been read at the read voltage VCG_BR3 and stored in the data latch XDL will be cancelled.

Then, in step S14, determination of the flag data FCBD is performed. Specifically, depending on the result of the determination of the flag data in the flag cell read at the read voltage VCG_BR3, the control circuit performs determination of the data read by supplying the read voltage VCG_AR1, which is lower than the read voltage VCG_BR3, to the selected word line WLs.

In step 14, when the threshold voltage of the flag data is higher than the read voltage VCG_AR1 (when the data of the flag cell is determined to be the "0" data), the current state is determined as the state after writing the upper page. In other words, the control circuit changes the determination in such a way that the upper page write operation has been completed for the data of the selected page. Accordingly, the operation is determined to proceed via an arrow "Yes" in step S14. Meanwhile, in step S14, when the threshold voltage of the flag data is lower than the read voltage VCG_AR1 (when the data of the flag cell is determined to be the "1" data), the current state is determined as the state before writing the upper page ("the state before writing the upper page" herein may also include a case of "a state where the data is erased prior to the write operations" where the write operation for the lower page is yet to be performed). Accordingly, the operation is determined to proceed via an arrow "No" in step S14.

In the case of "Yes" in step S14, the data of the memory cells MCs read by using the read voltage VCG_BR3 is moved from the data latch LDL to the data latch XDL in step S15. Thereafter, the control circuit outputs the data of the memory cells MCs, read by using the read voltage VCG_BR3, from the data latch XDL to the data input-output line IO. A computation circuit such as a flip-flop circuit is provided between the data latch XDL and the input-output IO in some cases. In other words, the case of "outputting the data from the data latch XDL to the data input-output line IO" may also include the case of outputting the data from the data latch XDL to the data input-output line IO via the computation circuit.

Meanwhile, in the case of "No" in step S14, the current state is the state before writing the upper page. Accordingly, the control circuit causes the data of the memory cells MCs, which is read by using the read voltage VCG_AR1 and stored in the data latch XDL, to be outputted to the data input-output line IO.

In summary, in the case of "Yes" in step S14, the data of the memory cells MCs read by using the read voltage VCG_BR3 is outputted to the data input-output line IO. Meanwhile, in the case of "No" in step S14, the data of the memory cells MCs read by using the read voltage VCG_AR1 is outputted to the data input-output line IO.

Moreover, when the operation is determined to proceed via the arrow "Yes" in step S12, the determination in step S14 is not performed and the data of the memory cells MCs read by using the read voltage VCG_BR3 is outputted from the data latch XDL to the data input-output line IO.

Thus, the data is correctly read from the selected memory cells MCs. The read operation for the lower page is hence completed.

In this operation, the data of the memory cells MCs read at the read voltage VCG_BR3 is stored in the data latch LDL in the case of "Yes" in step S14. Hence, there is no need to read the data again from the selected memory cells MCs at the read voltage VCG_BR3. As a result, the read operation can be performed at a high speed.

(Upper Page Read Operation)

FIG. 10 shows an example of a flowchart of an upper page read operation according to the embodiment. Description of operations similar to those in the lower page read operation is omitted. Step S20 is similar to step S10 of the lower page read operation. In the case of reading the upper page, as shown in step S21, the control circuit supplies the read voltage VCG_AR3 to the selected word line WLs and reads data from the selected memory cells MCs. At this time, the flag data FCAD is also read from the flag cell FCA for the upper page. The data of the selected memory cells MCs and the flag data FCAD thus read are held in any of the data latches LDL, UDL, and XDL. Then, as shown in step S22, the control circuit supplies a read voltage VCG_CR3 to the selected word line WLs and reads data from the selected memory cells MCs. The data of the selected memory cells MCs thus read and the data read at the read voltage VCG_AR3 are subjected to data computation to calculate upper data and the upper data is held in any of the data latches LDL, UDL, and XDL.

As shown in step S23, when the threshold voltage of the flag cell FCA is higher than the read voltage VCG_AR3 (when the flag data FCAD is determined to be the "0" data), the current state is the state after writing the upper page. Accordingly, the control circuit outputs the upper data to the input-output line IO ("Yes" in S23).

Meanwhile, as shown in step S23, when the threshold voltage of the flag cell FCA is lower than the read voltage VCG_AR3 (when the flag data FCAD is determined to be the "1" data), the current state is the state before writing the upper page ("No" in S23). Accordingly, as shown in step S24, the control circuit sets all the data in the data latch XDL to the "1" data as dummy data, for example, and outputs the data to the data input-output line IO.

The embodiment of the present invention has been described above. However, the embodiment is given as an example and is not intended to limit the scope of the invention. For example, the present invention can be also applied to a case where data of three bits or more is stored in each memory cell. Such novel embodiments can be carried out in various other modes and various omissions, replacements, and modifications can be made without departing from the gist of the present invention. For example, although the embodiment has been described with reference to the flag cell as an example, the present invention can be used for memory cells storing data for which an ECC is hard to generate (including a case where performances fall outside an operation specification and a current consumption specification when an ECC is generated). Moreover, the read voltages VCG_AR3 and VCG_BR3 are variable as shown in FIG. 6. This is because there may be a case where the read voltages VCG_AR3 and VCG_BR3 are adjusted due to data written in nearby memory cells.

The embodiments and their modifications are included in the scope and gist of the present invention and are also included in the invention described in the claims and equivalents thereto. Moreover, the embodiments described above can be carried out in combination.

What is claimed is:

1. A semiconductor memory device comprising:
a memory cell array including a plurality of memory cells which are each capable of storing data of n bits (n is a natural number of 2 or more) and which are arranged in a matrix, a plurality of word lines which are connected to the plurality of memory cells, and a plurality of bit lines which are each connected to one end of corresponding ones of the plurality of memory cells; and
a control circuit, wherein
a first memory cell of the plurality of memory cells stores first data of n bits,
a second memory cell of the plurality of memory cells stores second data used to determine whether data of k bits (k is a natural number from 2 to n inclusive) is stored in the first memory cell, and the control circuit:
performs first determination of determining data read from the data of the second memory cell by supplying a first read voltage to a first word line of the plurality of word lines,
performs second determination of determining data read from the second memory cell by supplying the first word line with a second read voltage different from the first read voltage, based on a result of the first determination, and
outputs either one of a result obtained by reading the data stored in the first memory cell at the first read voltage and a result obtained by reading the data stored in the first memory cell at the second read voltage, based on a result of the second determination.

2. The semiconductor memory device according to claim 1, wherein the second read voltage is lower than the first read voltage.

3. The semiconductor memory device according to claim 1, wherein the first and second read voltages are variable.

4. The semiconductor memory device according to claim 1, wherein the second determination is omitted when it is determined in the first determination that the data of k bits is stored in the first memory cell.

5. The semiconductor device according to claim 1, wherein
a plurality of memory cell strings each include corresponding ones of the plurality of memory cells, the corresponding memory cells connected in series to one another in a first direction,
the plurality of memory cell strings are arranged in a second direction intersecting the first direction,
one end of each of the plurality of memory cells strings is connected to a corresponding one of the plurality of bit lines, and
each of the plurality of word lines extends in the second direction and connects in common the memory cells arranged side by side in the second direction.

6. The semiconductor device according to claim 5, wherein the first memory cell and the second memory cell are connected to the same word line of the plurality of word lines.

7. The semiconductor device according to claim 6, wherein the control circuit:
reads the data from the first memory cell simultaneously with reading the second data from the second memory cell by supplying the first read voltage, and
reads the data from the first memory cell simultaneously with reading the data from the second memory cell by supplying the second read voltage.

8. The semiconductor device according to claim 6, wherein the control circuit:
stores the data read from the first memory cell at the first read voltage in a first latch, and
when determining in the second determination that the data of k bits is stored in the first memory cell, moves the data stored in the first latch from the first latch to a second latch and outputs the data from the second latch to a data input-output line.

9. The semiconductor device according to claim 6, wherein the control circuit:
stores the data read from the first memory cell at the first read voltage in a first latch,
stores the data read from the first memory cell at the second read voltage in a second latch, and
when determining in the second determination that the data of k bits is not stored in the first memory cell, outputs the data stored in the second latch from the second latch to a data output line.

10. The semiconductor memory device according to claim 1, wherein
the control circuit stores the first data in the first memory cell in a first write operation and stores data of k bits in the first memory cell by writing third data in the first memory cell in addition to the first data in a second write operation.

11. The semiconductor memory device according to claim 10, wherein in the second write operation, the control circuit stores the second data in the second memory cell simultaneously with writing the third data in the first memory cell.

12. The semiconductor memory device according to claim 11, wherein
the plurality of memory cells form $2^k$ threshold distribution areas in accordance with the data of $2^k$ bits, and
the second read voltage is a voltage between the $2^k/2-1$-th lowest threshold distribution area and the $2^k/2$-th lowest threshold distribution area.

13. The semiconductor memory device according to claim 12, wherein
the plurality of memory cells form $2^k$ threshold distribution areas in accordance with data of k bits, and
the first read voltage is a voltage between the $2^k/2$-th lowest threshold distribution area and the $2^k-1$-th lowest threshold distribution area.

14. The semiconductor memory device according to claim 13, wherein, the data of k bits stores at k=2:
data in one bit out of two bits for each of the threshold distribution areas lower than the $2^{(k+1)}/2$-th lowest threshold distribution area, and
data in the other bit out of the two bits for each of the threshold distribution areas higher than the $2^{(k+1)}/2$-th lowest threshold distribution area.

15. The semiconductor memory device according to claim 11, wherein the first determination and the second determination are performed when the first data is read from the first memory cell after the third data is written in the first memory cell.

16. The semiconductor memory device according to claim 11, wherein the first determination is omitted when the third data is read from the first memory cell after the data of k bits is written in the first memory cell.

* * * * *